US010859448B2

(12) United States Patent
Barnard et al.

(10) Patent No.: US 10,859,448 B2
(45) Date of Patent: Dec. 8, 2020

(54) MEMS CAPACITIVE SHEAR SENSOR SYSTEM HAVING AN INTERFACE CIRCUIT

(71) Applicant: UNIVERSITY OF FLORIDA RESEARCH FOUNDATION, INC., Gainesville, FL (US)

(72) Inventors: Casey A. Barnard, Gainesville, FL (US); Jessica C. Meloy, Seattle, WA (US); Mark Sheplak, Gainesville, FL (US)

(73) Assignee: University of Florida Research Foundation, Incorporated, Gainesville, FL (US)

(*) Notice: Subject to any disclaimer, the term of this patent is extended or adjusted under 35 U.S.C. 154(b) by 380 days.

(21) Appl. No.: 15/550,466

(22) PCT Filed: Feb. 11, 2016

(86) PCT No.: PCT/US2016/017489
§ 371 (c)(1),
(2) Date: Aug. 11, 2017

(87) PCT Pub. No.: WO2016/130766
PCT Pub. Date: Aug. 18, 2016

(65) Prior Publication Data
US 2018/0038746 A1 Feb. 8, 2018

Related U.S. Application Data

(60) Provisional application No. 62/115,317, filed on Feb. 12, 2015.

(51) Int. Cl.
*G01L 1/14* (2006.01)
*G01N 11/02* (2006.01)
(Continued)

(52) U.S. Cl.
CPC .............. *G01L 1/144* (2013.01); *B81B 7/007* (2013.01); *B81B 7/0064* (2013.01); *G01L 1/146* (2013.01);
(Continued)

(58) Field of Classification Search
CPC ........ G01L 1/144; G01L 1/146; B81B 7/0064; B81B 2207/012; B81B 2207/096;
(Continued)

(56) References Cited

U.S. PATENT DOCUMENTS 4,011,486 A * 3/1977 Oulton .................. H01H 47/20
361/182
4,896,098 A * 1/1990 Haritonidis ............ G01N 13/00
324/663
(Continued)

OTHER PUBLICATIONS

International Search Report and Written Opinion, International Application No. PCT/US2016/017489, PCT/ISA/210, PCT/ISA/220, PCT/ISA/237, dated Apr. 25, 2016.

*Primary Examiner* — Peter J Macchiarolo
*Assistant Examiner* — Monica S Young
(74) *Attorney, Agent, or Firm* — Alston & Bird LLP

(57) ABSTRACT

A sensor system comprising a Micro-Electro-Mechanical Systems (MEMS)-based capacitive floating element shear stress sensor, the associated packaging, and the interface circuitry required for operation as an instrumentation-grade sensing system is disclosed herein. One implementation of the interface circuitry is an analog synchronous modulation/demodulation scheme enabling time-resolved measurements of both mean and dynamic wall shear stress events, where a modulation section couples to the sensor for sensing wall shear stress at the surface of an object in a fluid and generates at least one bias signal from the sensor output signal. In response to the bias signal, a demodulation control circuit adjusts the phase of the bias signal and generates a
(Continued)

demodulation control signal from the phase adjusted signal. Consequently, in response to the demodulation control signal, a demodulation section synchronizes the rectification of the sensor output signal, while the phase information is maintained.

12 Claims, 13 Drawing Sheets

(51) Int. Cl.
    *B81B 7/00* (2006.01)
    *G01N 11/00* (2006.01)
    *H01L 23/00* (2006.01)
    *H05K 1/18* (2006.01)

(52) U.S. Cl.
    CPC ............ *G01N 11/00* (2013.01); *G01N 11/02* (2013.01); *H01L 24/48* (2013.01); *H05K 1/183* (2013.01); *B81B 2207/012* (2013.01); *B81B 2207/096* (2013.01); *H01L 2224/48227* (2013.01); *H01L 2224/48465* (2013.01); *H01L 2924/00014* (2013.01); *H01L 2924/1433* (2013.01); *H01L 2924/1461* (2013.01); *H01L 2924/3025* (2013.01); *H05K 2201/10151* (2013.01)

(58) Field of Classification Search
    CPC ........ B81B 7/007; G01N 11/00; G01N 11/02; H01L 24/48; H01L 2224/48227; H01L 2224/48465; H01L 2924/00014; H01L 2924/1433; H01L 2924/1461; H01L 2924/3025; H05K 2201/10151; H05K 1/183
    USPC ............................................. 73/841; 332/103
    See application file for complete search history.

(56) References Cited

U.S. PATENT DOCUMENTS

| | | | | |
|---|---|---|---|---|
| 5,182,760 | A * | 1/1993 | Montgomery | H04L 27/2276 329/306 |
| 5,199,298 | A * | 4/1993 | Ng | B81C 1/00158 73/147 |
| 5,523,715 | A * | 6/1996 | Schrader | H03F 3/38 330/10 |
| 5,847,619 | A * | 12/1998 | Kirisawa | H04L 27/20 332/103 |
| 6,288,619 | B1 * | 9/2001 | Hirai | H03C 3/40 332/103 |
| 6,341,532 | B1 * | 1/2002 | Xu | G01L 1/148 73/147 |
| 8,886,146 | B2 | 11/2014 | Andres et al. | |
| 2005/0072233 | A1 * | 4/2005 | Nozoe | G01C 19/5607 73/514.16 |
| 2006/0137467 | A1 * | 6/2006 | Horowitz | G01N 3/24 73/815 |
| 2007/0096829 | A1 * | 5/2007 | Woong | H03F 1/30 330/298 |
| 2007/0113651 | A1 | 5/2007 | Rioux | |
| 2008/0111714 | A1 * | 5/2008 | Kremin | G06F 3/044 341/33 |
| 2010/0037706 | A1 | 2/2010 | Sparks et al. | |
| 2011/0314924 | A1 * | 12/2011 | Chandrasekharan | G01N 13/00 73/780 |
| 2012/0234087 | A1 * | 9/2012 | Strahan | B60C 23/0408 73/146.3 |
| 2012/0297615 | A1 | 11/2012 | Zadesky et al. | |
| 2013/0336511 | A1 | 12/2013 | Underbrink et al. | |
| 2014/0125431 | A1 * | 5/2014 | Bhattacharjee | H03H 9/02275 333/186 |
| 2015/0276407 | A1 * | 10/2015 | Bhandari | G01P 15/18 73/504.12 |
| 2016/0157017 | A1 * | 6/2016 | Lesso | G01D 5/24476 381/71.7 |
| 2017/0059666 | A1 * | 3/2017 | Horsley | G01R 33/0041 |
| 2017/0146439 | A1 * | 5/2017 | Kim | G01N 13/02 |

* cited by examiner

Rectification

MEMS CAPACITIVE SHEAR SENSOR SYSTEM HAVING AN INTERFACE CIRCUIT

CROSS-REFERENCE TO RELATED APPLICATIONS

The present application is a national stage application of International Application No. PCT/US2016/017489, filed Feb. 11, 2016, which claims the priority benefit of U.S. Provisional Application Ser. No. 62/115,317, filed Feb. 12, 2015, both of which are incorporated herein by reference in their entirety.

GOVERNMENT SUPPORT

This invention was made with government support under grants awarded from The National Aeronautics and Space Administration (NASA) under grant numbers NNX11CG91P, NNX09AJ13H, and NNX07AB27A. The government has rights in the invention.

BACKGROUND

Using the current set of research tools, time-resolved characterization of complex, three-dimensional, wall-bounded flow fields may be difficult. One such wall-bounded flow field is the fluctuating wall shear stress field, which when acquired in real-time, may have the ability to significantly impact the characterization, design, and control of fluidic systems. However, real-time acquisition of the wall shear stress field is not available using the current set of research tools. In particular, although a Micro-Electro-Mechanical Systems (MEMS) shear stress sensor enables the direct measurement of wall shear stress on an associated lifting body (such as a plane or a submarine in a fluid or gas), this MEMS sensor is only available for bench-top testing.

Measurement of wall shear stress, however, may significantly impact the reduction of skin friction, which represents a component of parasitic drag upon the lifting body. In particular, skin friction drag occurs differently depending on the type of flow over the lifting body. That is, if the flow is laminar, layers of fluid move smoothly past each other affecting the drag differently than when the flow is turbulent, where the fluid possesses a fluctuating and irregular pattern. In consumer applications, the quantification and study of skin friction drag can assist in the design of more fuel-efficient automobiles and airplanes. Thereby, the reduction of skin friction drag, and hence the reduction of fuel consumption, is an area of research with immediate economic impact on multi-billion dollar consumer markets as well as emerging technologies.

An extension of the detection of drag is the study of flow separation, which occurs when the boundary layer of fluid around the solid body having viscous forces close to the solid surface travels far enough against an adverse pressure gradient that the speed of the boundary layer relative to the body falls almost to zero. As a result, the fluid flow becomes detached or separated from the surface of the solid body and takes on the forms of eddies and vortices. In aerodynamics and hydrodynamics, this separation often results in unfavorable effects such as increased pressure drag, increased effective body volume, flow losses, and stall. Since flow separation is related to the measurement of wall shear stress, a system would greatly benefit from the ability to make a time resolved, vector measurement of wall shear stress in order to detect and likely predict separation. However, the current systems do not have this ability.

For years, however, the use of MEMS shear stress sensors has remained in bench-top demonstrations only capable of calibration, but not of model integration or use in wind tunnel environments due to a lack of packaging development.

BRIEF SUMMARY

Aspects of this disclosure describe a sensing system having a differential capacitive MEMS shear stress sensor, interface circuitry required for operation as an instrumentation-grade sensing system, and the associated packaging of the sensor and interface circuitry. This sensor system transitions the dual comb drive floating element sensor from the bench top to the wind tunnel through the development of the appropriate mixed-signal circuitry and packaging of the sensor into a cylindrical tube structure. The sensor may be installed into a flat plate wind tunnel model, where measurements are compared with accompanying particle image velocimetry (PIV) measurements, Laser Doppler Velocimetry (LDV) measurements, hotwire velocity profiles, Pitot profiles, or any other measurement profile used to elucidate shear stress. In the alternative, the sensor system may be embedded in the surface or housing of an aerodynamic or hydrodynamic body.

The shear stress sensor system may comprise a sensor for sensing wall shear stress at the surface of an object in a fluid and, thereby, in response generate a sensor output signal. The sensor system may include one of a variety of MEMS-based capacitive floating element shear stress sensors. Embodiments of the shear stress sensor system may further comprise an interface circuit having a modulation section for generating at least one bias signal for biasing the sensor and a demodulation section for demodulating the sensor output signal. An embodiment of the demodulation section may include a rectification unit for rectifying the sensor output signal. A demodulation control circuit may generate a demodulation control signal in response to at least one bias signal. In particular, the demodulation control circuit may comprise a phase adjustment unit that generates a phase adjusted signal in response to at least one bias signal, where the phase adjusted signal is further processed to produce the demodulation control signal. In response to the demodulation control signal, the rectification unit synchronizes the rectification of the sensor output signal.

This non-intrusive MEMS enabled system is capable of directly measuring simultaneous directional AC and DC baseband shear stress values in real time with spatial and temporal accuracy, resolving significant flow components found inside turbulent boundary layers. It is capable of making a time resolved, vector measurement of wall shear stress in order to detect and likely flow predict separation. This measurement can be used in a feedback mechanism to enhance a system's ability to suppress and even prevent flow separation.

Beyond flow separation, this system uses direct time-resolved measurements of mean and dynamic wall shear stress to help clarify other complex flow fields, where traditional fluid measurement techniques used to estimate wall shear stress fail. The system's ability to make a wall shear stress measurement may also provide information about momentum transfer to the wall and overall flow state. Such information could help steer the design process to lower drag on aerodynamic (and hydrodynamic) surfaces.

The system's novel interface and support electronics incorporate a synchronous modulation/demodulation system employing a low noise active envelope detector for use with high impedance sensors, while maintaining phase information, and extending the measurement capabilities into mean capacitance shifts. Its fabrication process may include microfabrication of a Deep Reactive Ion Etching (DRIE) on Silicon On Insulator (SOI) defined H-bar suspended floating element with comb fingers for capacitive gap sensing. The packaging may include electronic through wafer interconnects, eliminating the inherent fragility associated with wire-bonds and providing a hydraulically smooth front surface. Experimental results support that this packaging implementation may have the capability of greatly reducing the direct application of stress to the floating element structure and amplifier connections during installation in test facilities. This provides for a high degree of overall robustness of the system disclosed herein. Concepts of modular packaging may add an element of interchangeability between parts, reducing cost of individual component failures and adding a further measure of cable strain relief to mitigate triboelectric effects during measurement of the shear stress values.

The sensor may include but is not limited to a floating element possessing a differential comb drive designed to meet the spatial and temporal requirements for use as a measurement tool of turbulent boundary layers. The capacitive sensing interface circuitry may comprise an analog synchronous modulation/demodulation system, which enables the system to make time-resolved measurements of both mean and dynamic wall shear stress events. The packaging of the sensor may create a hydraulically smooth surface for moderate Reynolds numbers with a small footprint to enable array design and non-intrusive installation.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DISCLOSURE

Figure 1:
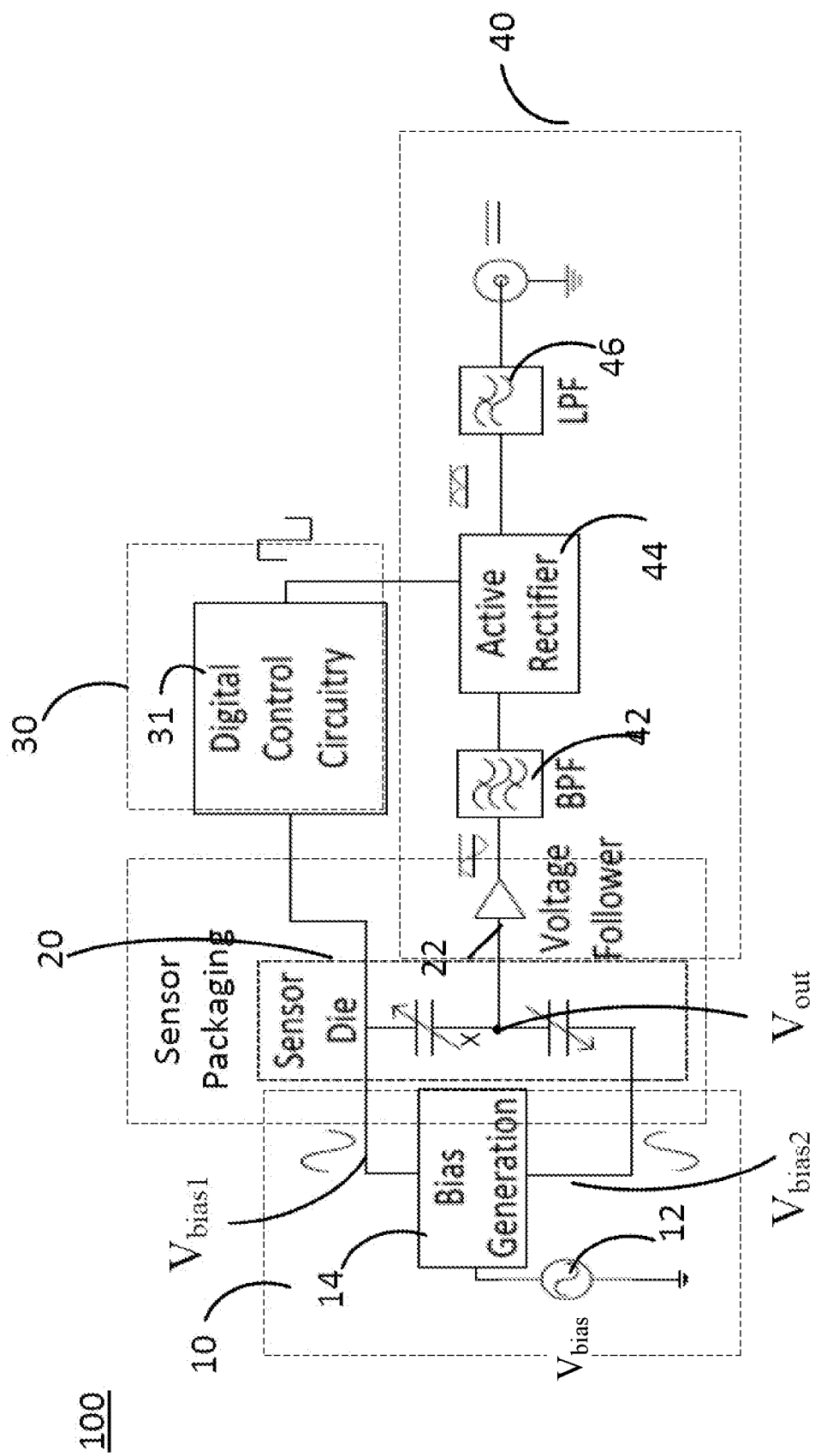
FIG. 1 illustrates a block diagram of an exemplary sensor system 100 having an active rectifier-based Synchronous (Synch) Modulator/Demodulator (MOD/DMOD) implementation, which includes a capacitive shear stress sensor.

Sensor systems, having interface circuitry, and methods for a measuring the shear stress of an object without greatly impacting the overall performance of the sensor are disclosed herein. The shear stress sensor system may comprise a sensor for sensing wall shear stress at the surface of an object in a fluid and, thereby, in response generate a sensor output signal. The sensor system may include one of a variety of MEMS-based capacitive floating element shear stress sensors. Embodiments of the shear stress sensor system may further comprise an interface circuit having a modulation section for generating at least one bias signal for biasing the sensor and a demodulation section for demodulating the sensor output signal. An embodiment of the demodulation section may include a rectification unit for rectifying the sensor output signal. A demodulation control circuit may generate a demodulation control signal in response to at least one bias signal. The demodulation control circuit may comprise a phase adjustment unit that generates a phase adjusted signal in response to at least one bias signal, where the phase adjusted signal is further processed to produce the demodulation control signal. Consequently, in response to the demodulation control signal, the rectification unit synchronizes the rectification of the sensor output signal.

The shear stress sensor system may further comprise packaging including a Printed Circuit Board (PCB), having a recess, and a sensor die seated within the recess. At least one wire-bond may couple the sensor die to a conductive layer that extends through the PCB from the front surface of the PCB to the back surface of the PCB. The system may be housed in a tube structure having a first and a second end, where the back surface of the PCB coupled to the first end of the tube structure. Further, an interface circuit, seated in the tube structure at the second end, may couple to the conductive layer at the back surface of the PCB.

In the alternative, the packaging may include a Through Silicon Via (TSV) sensor die in overlying relationship with the front surface of the PCB. The packaging may further include a shim cap having a recess, wherein the TSV sensor die is seated to couple to at least one conductive plug that extends through the PCB. The PCB and shim cap having the TSV sensor die seated within its recess may rest in a first end of a tube structure, such that the PCB and the shim cap are seated flush within the walls of the first end. The interface circuitry sits within the tube structure and couples to a wire-bond that connects to the PCB.

The packaging of the sensor creates a hydraulically smooth surface for moderate Reynolds numbers with a small footprint to enable array design and non-intrusive installation. A compact sensor package combined with a synchronous modulation/demodulation system may be mounted in a flat plate model located within an open-loop low-speed wind tunnel. The MEMS sensor output generates the mean wall shear stress, which is estimated from the velocity profile curve fits, where Particle Image Velocimetry (PIV) may also be used to measure the boundary layer velocity profiles for laminar, transitional and turbulent flows.

Figure 4:
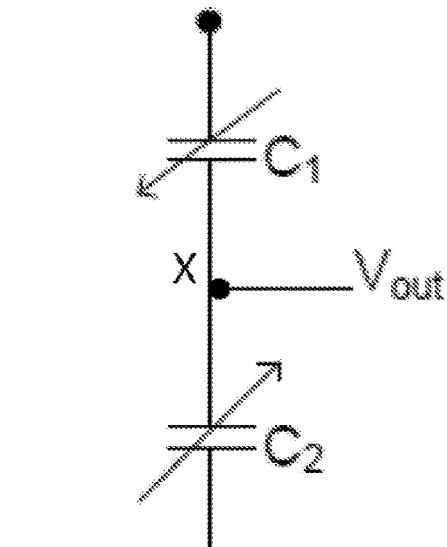
FIG. 4 illustrates an example circuit representation of the sensor.

FIG. 1 illustrates a block diagram of an exemplary sensor system 100 having an active rectifier-based Synchronous (Synch) Modulator/Demodulator (MOD/DMOD) implementation, which includes a capacitive shear stress sensor. As shown in FIG. 1, the interface circuit (10, 30, and 40) couples to the sensor die 20 and comprises three components: a modulation block 10, a demodulation block 40, and a demodulation control block 30. After review of the basic noise models and other non-ideal characteristics of passive components and operational amplifiers along with some common interface circuits, such as the unity gain voltage buffer, open-loop and closed loop topologies, the closed loop envelop detector implementation of a Synch MOD/DMOD proved to be the best design for interface circuit (10, 30, and 40). As such, interface circuit (10, 30, and 40) serves as a data acquisition circuitry that retrieves the signal generated by the sensor die 20, including but not limited to a capacitive transducer. Circuit (10, 30, and 40) may read the voltage output signal $V_{out}$ of the capacitive shear stress sensor 20 present at the middle node of the differential capacitor, as shown in FIG. 4, without altering the voltage output signal $V_{out}$.

To properly demodulate the mean shear stress signal while still preserving the directional information, an active rectifier envelope detector 44 may be included in the demodulation block 40. One of the bias signals $V_{bias1}$, $V_{bias2}$ generated by the modulation block 10 may be used to create a digital synchronization control signal (generated by the digital control circuit 31), which controls the rectifier 44, preserving the phase of the sensor's signal $V_{out}$ to be explained in more detail as follows.

An additional benefit to having to modulate and then demodulate the sensor output is that it may provide a certain immunity to low frequency noise. Before the rectification stage 44, any contributions to the signal below the bias frequency are filtered out. This means that the low frequency noise characteristics of the immediate interface circuitry (10, 30, and 40) is filtered.

The voltage follower 22 may comprise a unity gain operational amplifier. By placing the voltage follower 22 at the sensor output, the impedance is buffered down to nominally a short circuit. This design may reduce interference. Since the amplifier of the voltage follower 22 may preferably be placed as close as possible to the sensor output $V_{out}$ in order to maximize its effectiveness as an impedance buffer, the voltage follower 22 is included within the sensor packaging, as shown in FIG. 1. Thereby, the positioning of the voltage follower 22 may condition the sensor impedance down to mitigate ElectroMagnetic Interference (EMI). The voltage follower 22 may also be co-located with the sensor die 20 in order to reduce the parasitics associated with cabling going to and from the sensor die 20. The rest of the circuitry for the interface circuit (10, 30, and 40) may be located an arbitrary distance from the sensor in order to reduce restrictions on its size. In the alternative, an active rectifier 44 may be included within the sensor packaging.

This chosen topology isolates the majority of the circuitry (10, 30, and 40) from interfacing directly with the sensor 20. The point where the sensor 20 may be loaded by the interface circuit (10, 30, and 40) is at the node "X" between the common electrode of the sensor and the input to the voltage follower 22. The voltage follower 22 may include a finite input impedance, which may be modeled as a parallel resistance and capacitance. In this case, the parallel input capacitance will act as an attenuation factor to the sensor. The expected output voltage given an input shear force becomes:

$$V_o = V_b H_{gap} \left( \frac{C_{10} - C_{20}}{C_{10} + C_{20} + (C_P + C_I)(1 - k^2)} \right) \frac{\delta(\tau_w)}{g_{01}} \quad [1]$$

where $C_{10}$ and $C_{20}$ are the nominal device capacitances, $C_p$ are the device parasitics, $C_i$ is the input capacitance of the amplifier, $V_b$ is the bias voltage applied to the sensor, $H_{gap}$ is the attenuation due to the secondary gap between comb fingers, k is the coupling coefficient, $g_{01}$ is the dimension of the primary gap, and $\delta(\tau_w)$ is the deflection of the floating element due to an input shear stress.

Figure 2:
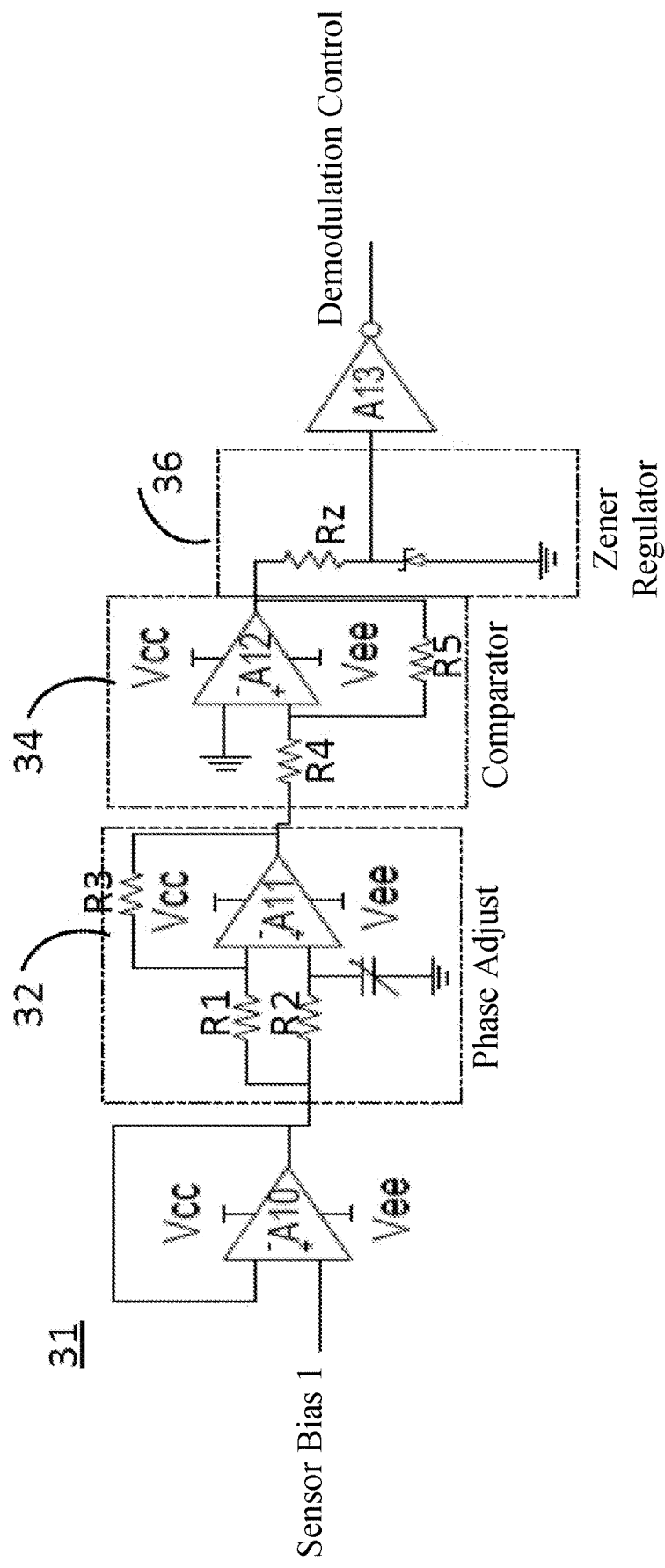
FIG. 2 shows an exemplary block diagram for the demodulation control block 30 of the Synch MOD/DMOD system 100 disclosed herein.

FIG. 2 shows an exemplary block diagram for the demodulation control block 31 of the Synch MOD/DMOD system 100 disclosed herein. Functionally, Sensor Bias 1 is pulled from the modulation block 10 and fed through a unity gain buffer A10, creating an isolated version of the waveform (including, but not limited to a sinusoidal or square waveform) to generate a TTL control signal. This buffered signal then passes through a phase adjustment circuit 32 allowing for user control of signal rectification. In an embodiment where the waveform is sinusoidal, a resultant phase-shifted sinusoid may be input into a comparator 34, creating a 10V/−10V square wave. The comparator output may then be fed into a Zener regulator 36 that regulates these voltages down to 0V and 5V. Functionally, when the sinusoid is negative, the combination of comparator 34 and Zener regulator 36 outputs equal 0V; however, when it is positive, the combination outputs 5V. This ideally creates a 50% duty cycle square wave. Finally, the square wave may be fed through a standard logic inverter A13, producing the demodulation control signal. The logic inverter A13 provides an additional level of noise rejection, since the input of the inverter A13 acts as a switch control, where the switch selects between the 5V rail and the ground of the system rather than using the derived signal to directly trigger the demodulation switch of the demodulation block shown in FIG. 6 (to be described as follows). Finally, the demodulation control signal passes into a final signal conditioning block in order to reclaim the baseband flow information. This demodulation control signal is sent to a rectification section of the demodulation block 40, which is described with reference to FIG. 6 as below.

Figure 3:
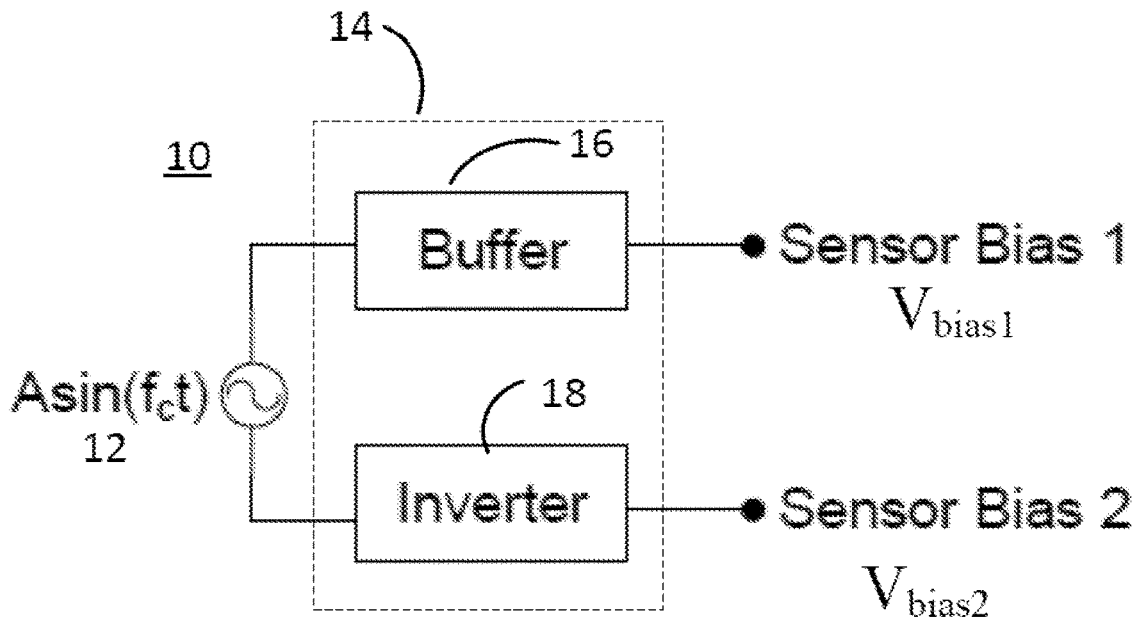
FIG. 3 illustrates a block diagram of a modulation block 10, providing an exemplary generalized schematic of a bias generator for modulating a signal and providing two out of phase sinusoids at each sensor bias node.
Figure 5:
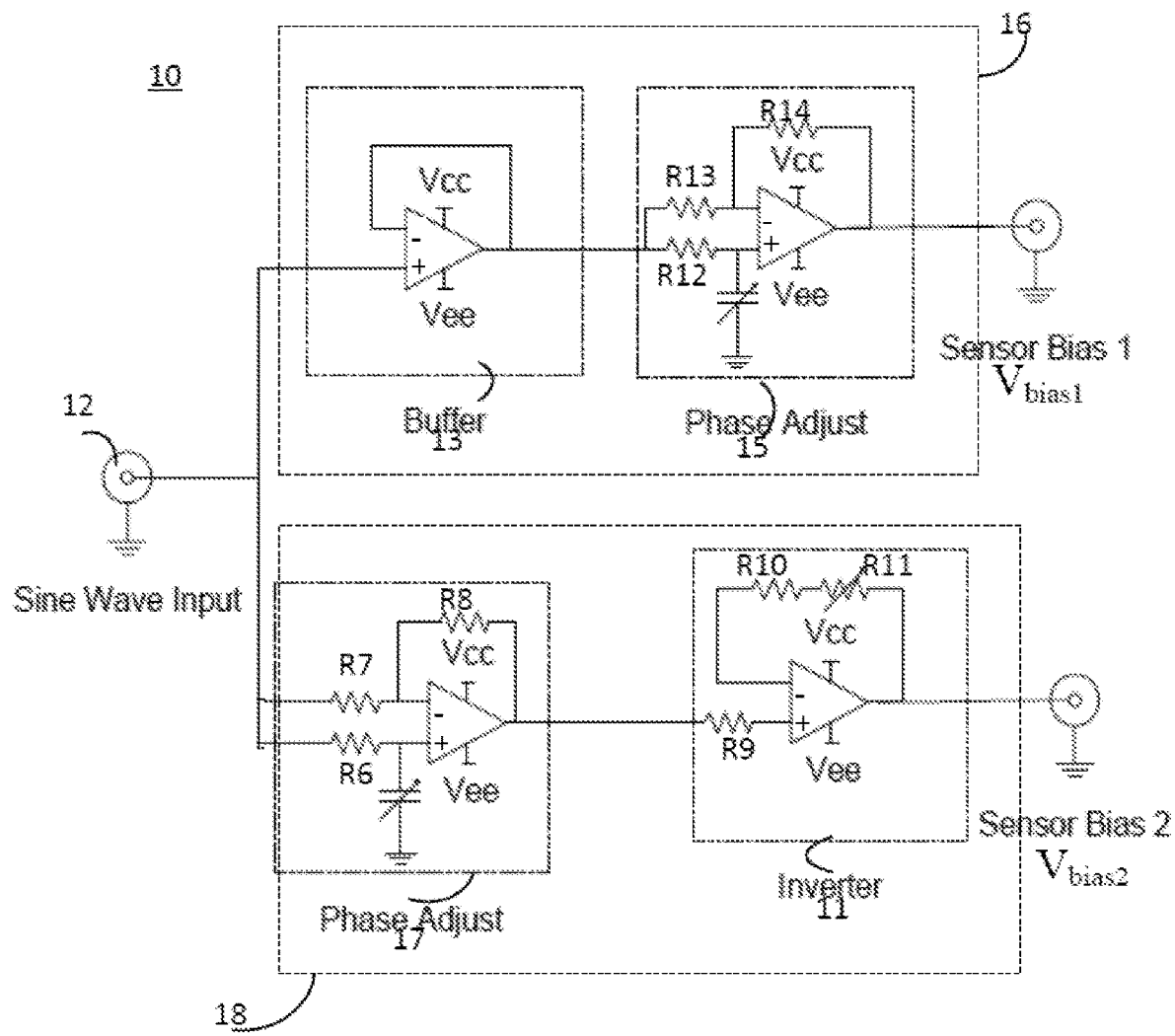
FIG. 5 shows an exemplary block diagram for the modulation block 10 of the Synch MOD/DMOD system 100 disclosed herein.

FIG. 3 illustrates a block diagram of modulation block 10, providing an exemplary generalized schematic of a bias generator for modulating a signal and providing two out of phase sinusoids at each sensor bias node; while FIG. 5 shows an exemplary block diagram for the modulation block 10 at a more detailed level. The modulation block 10 includes the sensor bias circuit 14 coupled to an external signal source 12, two phase shift circuits including a buffer 16, and an inverter 18, configured as shown in FIGS. 3 and 5. It should be noted that although the signal source 12 may generate a sinusoidal waveform signal, it may also comprise a waveform generator that generates various other waveforms, including but not limited to a square wave, triangle wave, microwave, radio-frequency (RF) signal, or any other type of electromagnetic signal. Ideally, the buffer and inverter portions (16, 18) of the circuit provide the 1800 phase shift between the two bias signals (SensorBias1 and SensorBias2). However, the phase between the buffer and inverter blocks (16,18) will not be exactly 1800 due to a small offset. As such, the buffer 16 may comprise a phase adjust circuitry 15, which is used to compensate for this small offset. Yet, unmatched cabling and impedance mismatches in the sensor 20 generated during fabrication may also contribute to any mismatches. Additionally, the phase adjust circuitry 15 may be used to give a best-case signal at the Synch MOD/DMOD circuit board output.

The modulation block 10 may generate at least two out of phase sinusoids (SensorBias1 and SensorBias2) for biasing the sensor 20 and provides the basis of the demodulation control signal generated by digital control circuitry 31 of demodulation control block 30 (as detailed supra). In particular, the modulation block 10 may be divided into two blocks to generate two out of phase sinusoids: one for inversion and one for buffering. This nominally creates a 180° phase shift between the two bias signals (SensorBias1 and SensorBias2) applied to the sensor such that Sensor Bias 1=A sin(ωt) and Sensor Bias 2=−A sin(ωt). Applying these biases to the generalized sensor impedance bridge, seen in FIG. 4, the output voltage of the sensor is $$V_{out} = \frac{C_2 A \sin(\omega t) - C_1 A \sin(\omega t)}{C_1 + C_2}. \quad [2]$$

Assuming that $C_1 = C_0 - \Delta C$ and $C_2 = C_0 + \Delta C$, this becomes $$V_{out} = \frac{\Delta C}{C_0} A \sin(\omega t). \quad [3]$$

As the inverter 18 and buffer 16 may have slight phase offsets, the impact of phase error should be considered. To account for phase errors in bias generation, the second bias becomes Sensor Bias 2=−A sin(ωt+φ). The resulting sensor output is $$V_{out} = \frac{(C_0 + \Delta C) A \sin(\omega t) - (C_0 - \Delta C) A \sin(\omega t + \phi)}{2 C_0}. \quad [4]$$

Simplifying and assuming that φ is very small Equation 3 becomes $$V_{out} = \frac{\Delta C}{C_0} = A \sin(\omega t) + \frac{\phi A}{2} \cos(\omega t). \quad [5]$$

This illustrates that while the sensitivity of the device is not affected, a DC offset is generated.

The addition of a variable resistor R11 in the inverting amplifier 11 driving Sensor Bias 2 allows for some compensation for DC signals generated by non-ideal sensor impedances. Consider $C_1 = C_0 - \Delta C$ and $C_2 = 1.5\ C_0 + \Delta C$ of FIG. 4, Equation 2 becomes $$V_{out} = \frac{0.5 C_0 + 2\Delta C}{2.5 C_0} A \sin(\omega t) = \frac{0.5}{2.5} A \sin(wt) + \frac{2\Delta C}{2.5 C_0} A \sin(\omega t). \quad [6]$$

This shows a DC offset term generated by the impedance mismatch along with a slight attenuation in device sensitivity. If the bias is changed such that Sensor Bias 2=−βA sin(ωt+4>) and β=1.5 equation 5 is now $$V_{out} = \frac{(1.5 C_0 + \Delta C) A \sin(\omega t) - (C_0 - \Delta C) \beta A \sin(\omega t)}{(1.5 C_0 + \Delta C) + (C_0 - \Delta C)}. \text{ or} \quad [7]$$

$$V_{out} = \frac{[(1.5 C_0 + \Delta C) - (1.5 C_0 - 1.5\Delta C)] A \sin(\omega t)}{(1.5 C_0 + \Delta C) + (C_0 - \Delta C)} = \frac{2.5 \Delta C}{2.5 C_0} A \sin(\omega t). \quad [8]$$

Comparing this result to Equation 2, where the capacitances are balanced, the nominal sensitivity is produced without additional DC offset. Ideally the gain value of equation 8 should be selected during calibration and then set for the lifetime of the sensor system. Although an exemplary embodiment may enable the end user of the instrument to change this gain, it may be disadvantageous because the end user may change the gain beyond the nominal point shown in equation 8, resulting in a change in device sensitivity.

The modulation portion 10 of the Synch MOD/DMOD system 100 may include an on-board oscillator for the bias signal generation. The modulation portion can further include power management circuitry, and can include features to mitigate impedance and various noise issues. In one example of a Synch MOD/DMOD system 100, the bias frequency may be set at any frequency; however, a preferable setting may be one that is a factor of 10 above the mechanical resonance of the sensor of interest. As noted supra, signal source 12 may comprise a waveform generator that is configured to generate any Alternating Current (AC) signal, including but not limited to a sinusoidal signal, square wave signal, triangle wave signal, microwave signal, radio-frequency (RF) signal, or any other type of electromagnetic signal.

Figure 6:
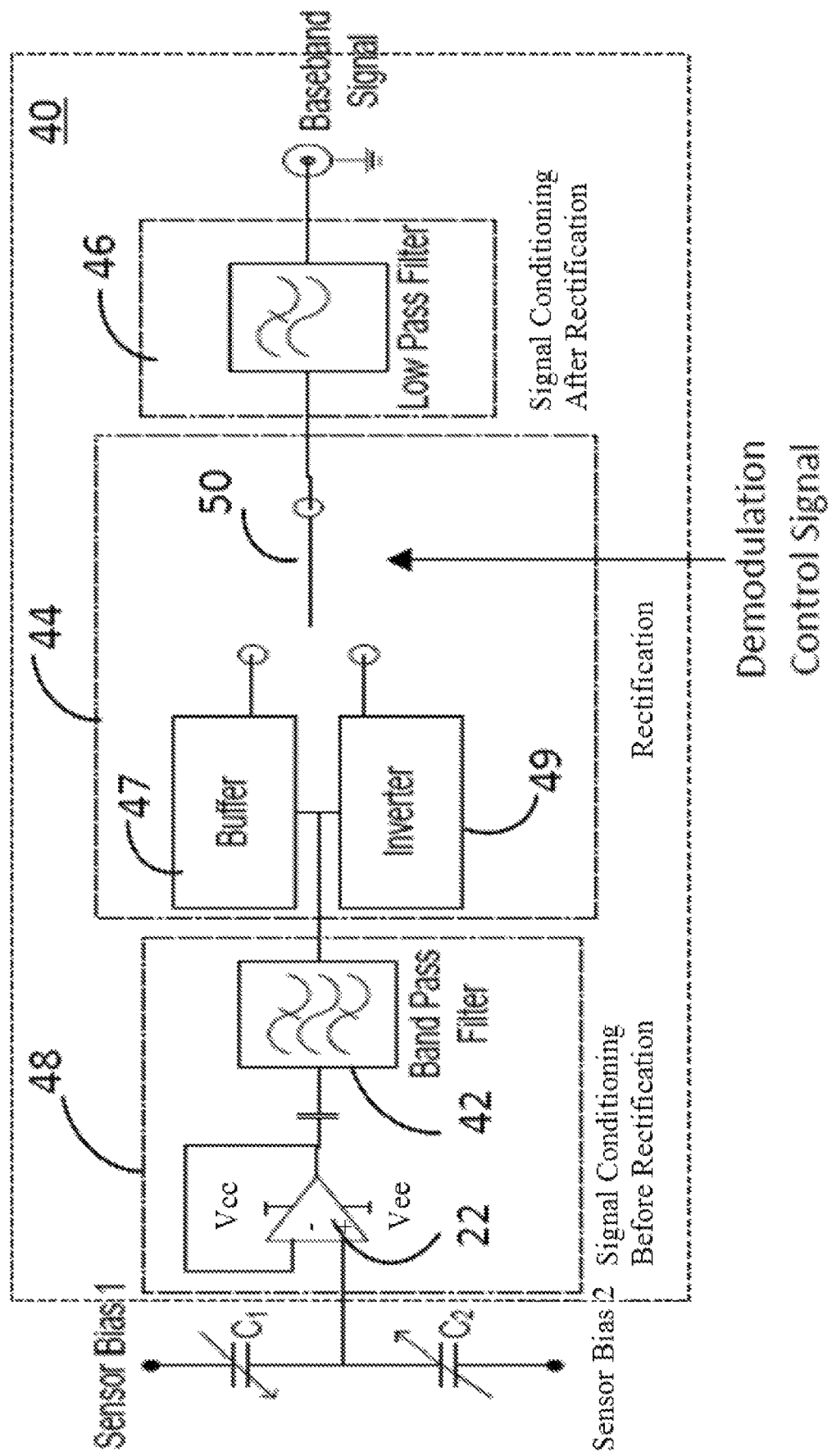
FIG. 6 displays a block diagram for an example of the demodulation block 40 of the Synch MOD/DMOD system 100 disclosed herein.

FIG. 6 displays a block diagram for an example of the demodulation block 40 of the Synch MOD/DMOD system 100 disclosed herein. For this implementation of the demodulation block 40, the demodulation method comprises the envelope detector method, implemented by the circuitry of active rectifier 44. However, the sensing system disclosed herein is not limited to the envelop detection method. The system may comprise a demodulation block including either a mixer based implementation or an envelope detector implementation. Further, since sensor 20 is a high impedance device, immediate impedance buffering may be used to prevent electromagnetic interference and signal attenuation. In this example, the demodulation block 40 may include the signal path from the output of the sensor 20 to the read out of the base band signal. However, as discussed supra, the unity gain amplifier 22 may be implemented and co-located with the sensor die 20, where the rest of the demodulation block 40 is located on a PCB. Regarding the embodiment shown in FIG. 6, the demodulation block 40 includes both signal conditioning pre-demodulation and the process of demodulation. Specifically, the demodulation block 40 may comprise several sub-sections, including a first signal conditioning block 48, a rectification unit 44, and a second signal conditioning block 46. Each section is described individually in the following sections.

Figure 7:
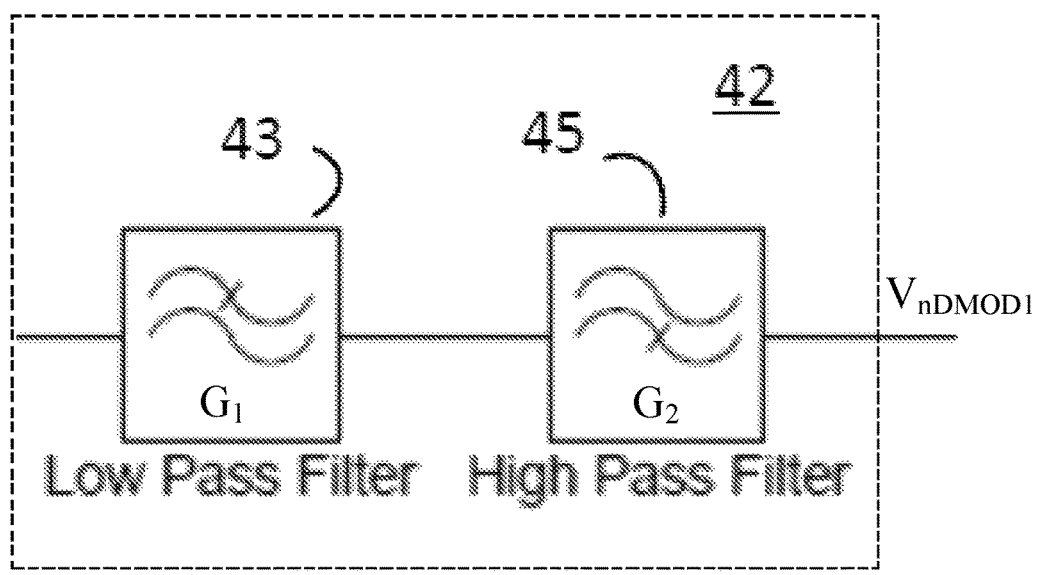
FIG. 7 illustrates an example of the block diagram for the signal condition unit 48 prior to the rectification unit 44.

The first signal conditioning block 48 may comprise the unity gain amplifier 22 and the band pass filter 42. The band pass filter 42 may include a low pass filter 43 and high pass filter 45 coupled in series as shown in FIG. 7. Generally, the low pass filter 43 needs to be of sufficiently high order to filter out the second harmonic of the bias frequency. The high pass filter 45 is of a lower order since it is configured to filter out DC offsets and/or noise associated with EMI from speakers, fan drivers, or other wind tunnel related sources. Although the low pass filter portion 43 of the band pass filter 42 is positioned as the first filter, the high pass filter portion 45 may be hold the first filter position. That is, FIGS. 6 and 7 illustrate an example of the block diagram for the first signal conditioning block 48, where the low pass filter 43 couples between the voltage follower 22 and the high pass filter 45. Yet, in another example of the first signal conditioning block 48, the band-pass filter 42 may be implemented using a high pass filter 45 coupled between the voltage follower 22 and the low pass filter 43. The corner frequency of the band pass filter 42 may be set at 100 kHz, representing a decade down from the bias frequency. The low-pass component 43 may be constructed using a fifth-order elliptic filter in the LT1560 from Linear Technologies. The change in filter components may also reduce the complexity of the circuit board layout, as the LT1560 is pre-programmed for a bandwidth of 1 MHz and does not require external components.

In another embodiment, the band pass filter 42 may be implemented using two different analog filters, a single-pole high pass filter, and a fourth order low pass Chebyshev filter. The bandwidth of the high-pass filter may be set to slightly exceed the sensor bandwidth in an effort to ensure that the entirety of the sensor output signal is within the flat band region of the filter.

Any nonlinearities in the modulation frequency or higher order mixing products will appear above the carrier frequency, starting at the second multiple of the carrier frequency. The higher order low pass filter ensures that regardless of the harmonic content of the oscillator chosen as a modulation signal, the harmonics will be sufficiently rejected before demodulation. The circuit may include a LT1563 by Linear Technologies, since it possesses flexibility and a low noise floor. It also allows for the addition of gain by a single resistor selection.

Figure 8:
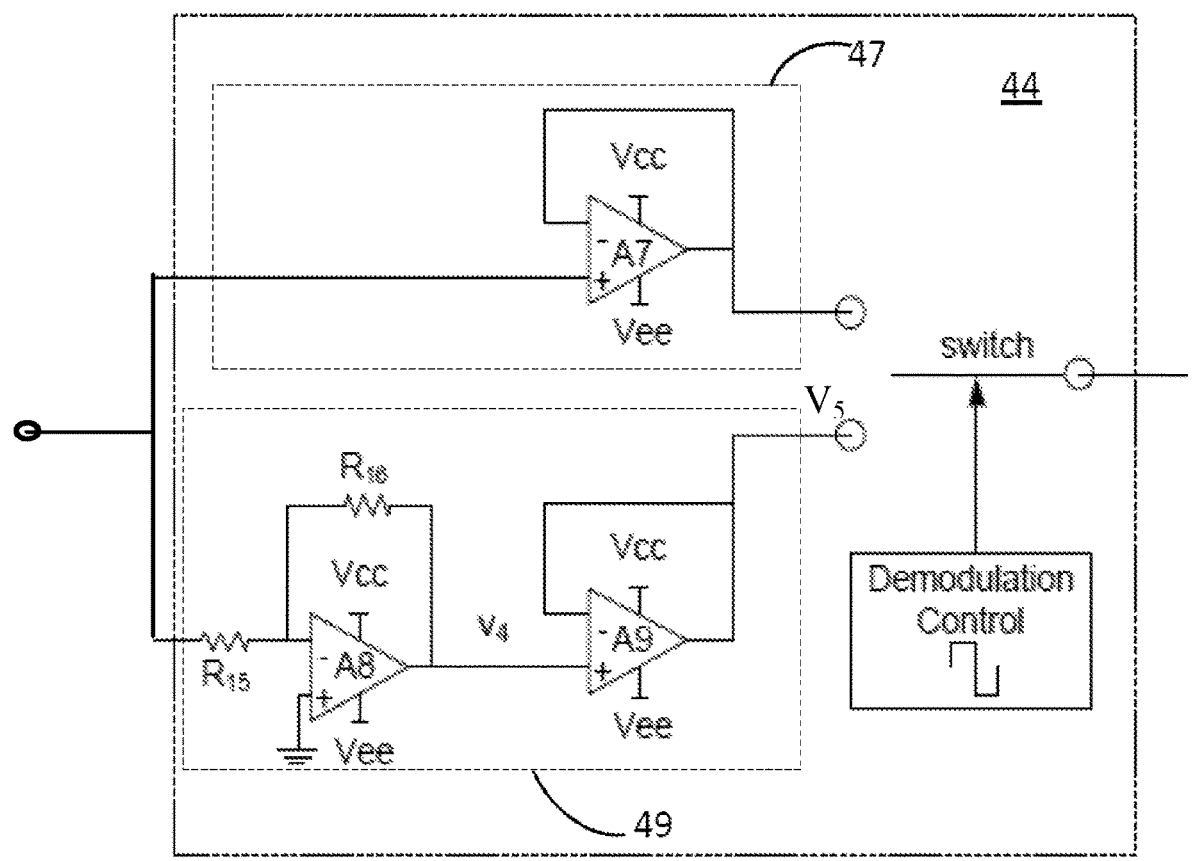
FIG. 8 shows a schematic of an exemplary rectification unit 44 for the demodulation block 40 of FIG. 6.

FIG. 8 shows a schematic of an exemplary rectification unit 44 for the demodulation block 40 of FIG. 6. Two out of phase versions of the source signal are generated using inverter and buffer blocks, like those described in the modulation block, as shown in FIGS. 3 and 5. As shown, the rectification unit 44 may comprise a buffer section 47, an inverter section 49 and a switch 50 controlled by the demodulation control signal generated by digital control circuitry 32. Rectification may be achieved by switching between two out of phase versions of the filtered sensor output. The switching is synchronized to one of the bias signals using the demodulation control signal. The implementation of this synchronization preserves the phase of the original flow information. The rectification of the signal may be performed using the switch 50, comprising an analog Double-Pole Single-Throw (DPST) switch 50. The frequency translation of this synch MOD/DMOD implementation works in two ways; it demodulates the high frequency sensor data back down to the baseband and up-converts the low frequency noise of the system to the modulation frequency.

Signal rectification may also be achieved by using a switch 50 comprising a single pole double throw (SPDT) solid-state switch that alternates between the filtered signal and an inverted version of the filtered signal. The switch control may be assumed to possess a 50% duty cycle square wave that is phase locked to Sensor Bias 1.

In operation, the signal generated by the first conditioning unit 48 is split into two paths, one that is inverted in section 49 and one that is simply buffered in section 47. As there is no gain in either path, the Gain BandWidth Product (GBWP) of the amplifiers of the buffer may exceed 1 MHz for this example demodulation block. In particular, the initial signal conditioning section 48 also feeds into an inverter followed by a unity gain buffer, generating a signal to be passed through the rectifier 44 during the negative portion of the demodulation control signal. The resulting output is a rectified version of the input signal ($V_{out}$). The rectification direction indicating whether the signal is rectified in a positive direction or a negative direction, depends on the phase relationship between the input signal and the demodulation control signal. In this particular example, as with the band-pass stage 42, the active rectifier components may also need to be chosen to accommodate for a 1 MHz bias frequency.

A DG419L high-speed SPDT switch may be used to rectify the signal. Additionally, this rectification unit 44 may further include a buffer added between the inverting channel and the switch 50, such that each switch path loads the switch 50 equally and the switching time is nominally symmetric. In another embodiment, the demodulation control signal may be generated to be compatible with higher bias frequency performance.

The rectified signal that is produced by rectification unit 44 passes into a final signal conditioning block 46 in order to reclaim the baseband flow information and to complete the demodulation. In order to reclaim the baseband information, the rectified signal may be low pass filtered. The order of this low pass filter 46 is dependent on the difference between the sensor bandwidth and choice of bias frequency. The chosen filter may comprise a LTC1563 (by Linear Technologies), which may be configured for a cutoff frequency of 20 kHz. The LTC1563 may be a preferred selection since the cutoff frequency is determined by a single resistor, so it is adjustable without reconfiguring multiple components or layout after it is implemented. The LTC1563 has low DC offset. Additionally, when configured as a fourth-order low-pass filter, it has 0.5 dB pass-band ripple, making it ideal for baseband applications. The selection of this filter 46 sets the total available sensor system bandwidth for this implementation; which may be extendable by changing the supporting resistor values.

Four different voltage potentials may be used in this system implementation: +12 Vdc, −12 Vdc, +5 Vdc, and −5 Vdc. These voltages may be derived from a single AC adapter with a +12 Vdc output (not shown). Three active voltage regulators may be used to derive the additional required potentials. For example, the +12 Vdc output of the AC adapter may be used to source the regulators that generate the −12 Vdc and +5 Vdc potentials, where the −12 Vdc rail may provide the voltage necessary to source the −5 Vdc potential. In a specific embodiment, the −12 Vdc rail may be generated using a power brick from Acopian; while the −5 Vdc and +5 Vdc potentials may be generated using Texas Instrument's LM7905C and LM7805 linear voltage regulators, respectively. These linear regulators source the entire demodulation chain rather than the switching supplies in order to prevent the feed through of power supply noise into the ultimate sensor system output.

Figure 9:
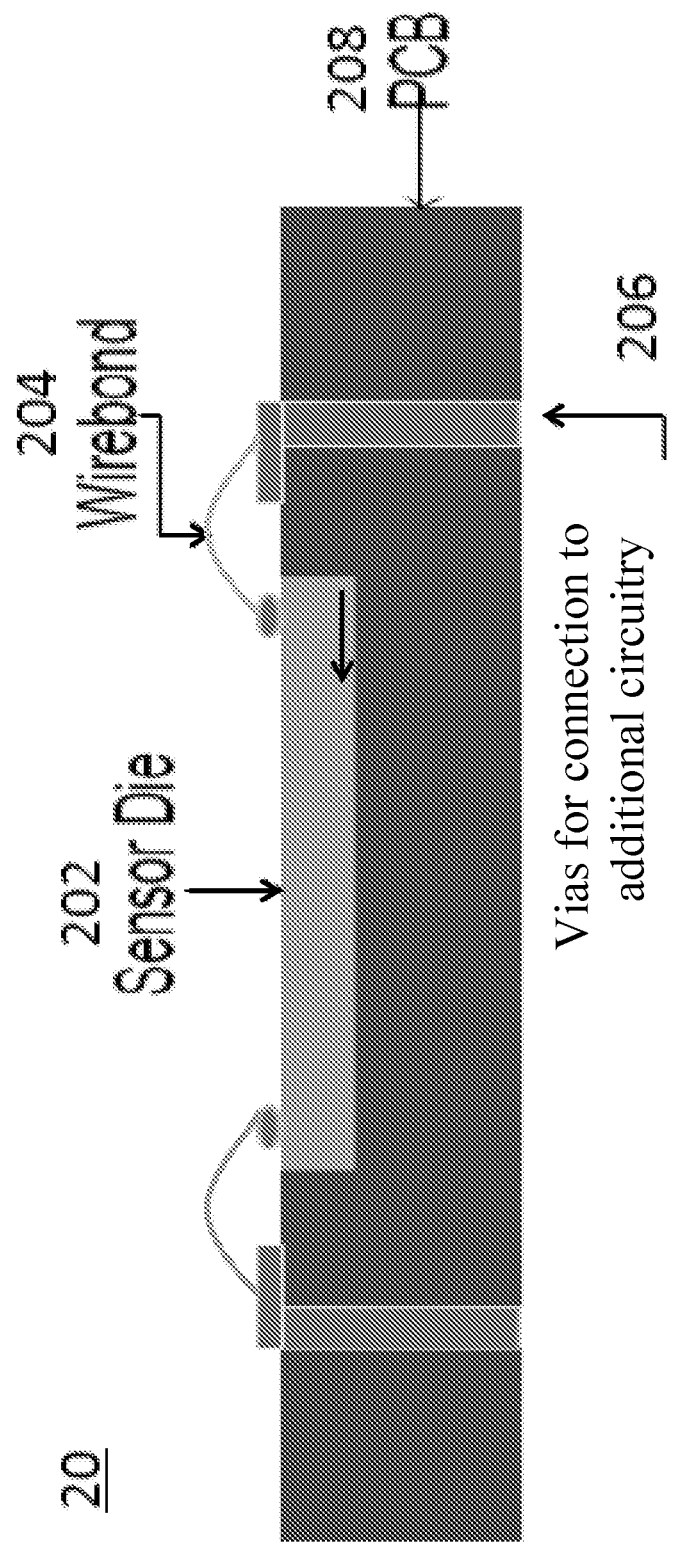
FIG. 9 displays a schematic of the assembly of the PCB end cap 208 for flush mounting Silicon-on-Pyrex devices.
Figure 10:
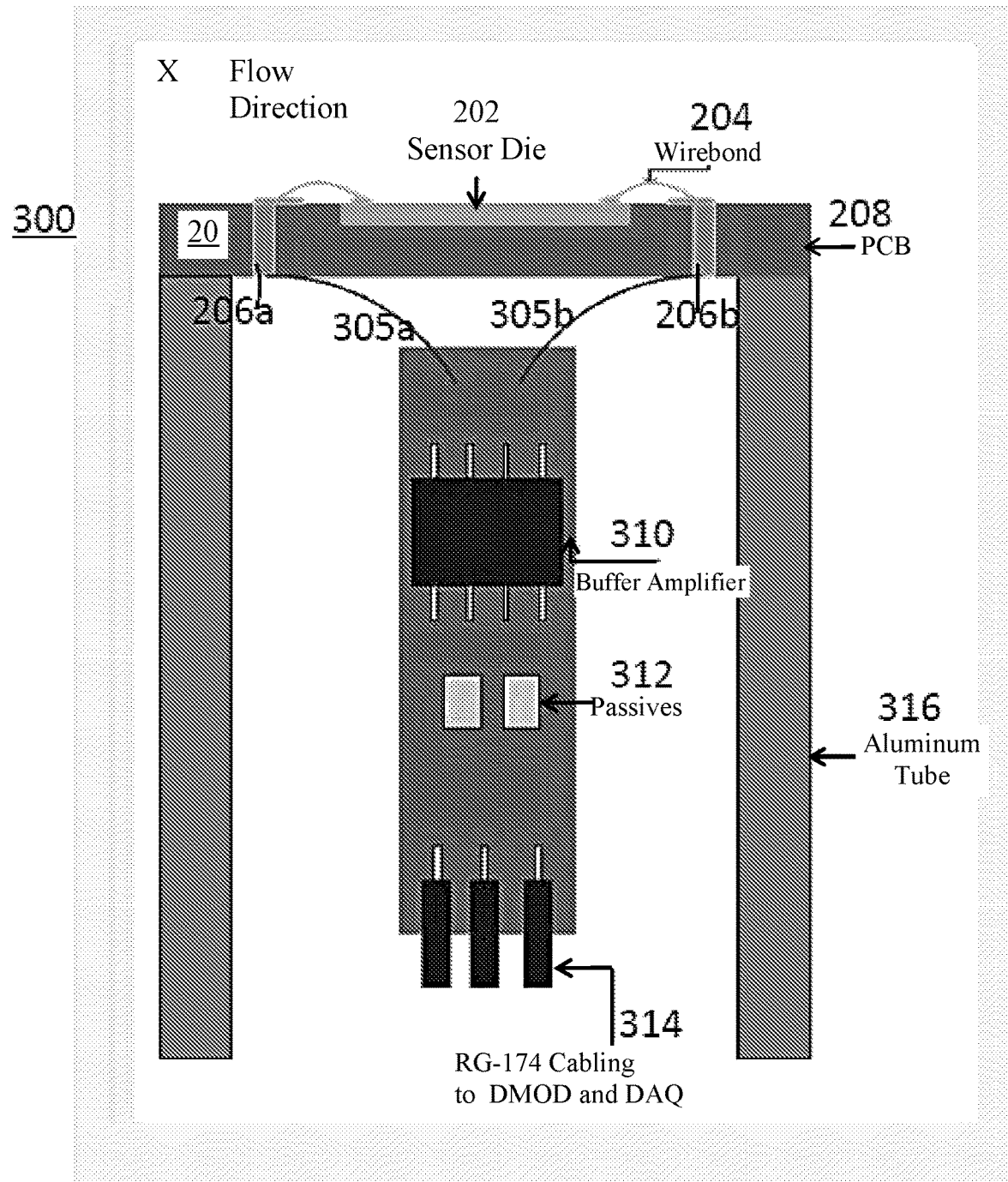
FIG. 10 illustrates a first exemplary sensor system tube packaging design 300 of the Synch MOD/DEMOD system disclosed herein.

FIG. 9 displays a schematic of the assembly of the PCB end cap 208 for flush mounting Silicon-on-Pyrex devices, while FIG. 10 illustrates a first exemplary sensor system tube packaging design 300 of the Synch MOD/DEMOD system disclosed herein. As part of the sensor design 300, a robust cylindrical shaped package 316 was developed to house the shear stress sensor 202 and allow for the impedance buffering amplifier 310 to be placed as closely to the high impedance device 20 as possible in order to prevent EMI. In addition to the immediate buffering of the sensor signal, the cylinder 316 may be a grounded aluminum sleeve which acts as a Faraday cage to further protect the sensor system from interference.

Packaging a MEMS sensor requires all of the same considerations given to integrated circuit packaging, but with added complexity since it requires that the sensor may be exposed to the environment. The packaging disclosed herein leverages existing printed circuit board technology with a laser machined shim cap to achieve a hydraulically smooth surface capable of interfacing with additional circuit boards. This shim cap may be combined with additional mechanical supports to create a robust package suitable for use in wind tunnel facilities. In particular, the sensor die 202 may be flush mounted within a printed circuit board (PCB) 208. Wires and bond pads 204 may be patterned onto the PCB 208, where the design of PCB 208 also enables backside connection of the interface circuitry at vias 206a and 206b. The sensor 202 may be wire-bonded 204 to the PCB 208 with metal wires that do not exceed 100 m in height, such that the sensor 20 can be considered hydraulically smooth for most low speed applications. The metal wires may be include any suitable conductive material (e.g., copper, silver, gold, platinum, iridium, platinum-iridium, platinum-gold, conductive polymers, etc.) or combinations of conductive (and/or noble metals) materials.

As an example, the sensor package size may be a 12.7 mm outer diameter tube that is 19.0 mm long, representing a significant reduction from a bench top implementation. The low cost, small tube design allows for novel installations into scale models with a high channel density.

The four major considerations that shape the package are induced stress, hydraulic smoothness, sensor installation density, and the proximity of interface electronics. In order to keep non-recoverable engineering costs low and still produce an effective package, the packing may include current packaging techniques for microphones or MEMS pressure transducers, such as Kulites.

As shown in FIG. 10, the sensor 200 may be seated within the end cap 208 and separated from the interface electronics 310, 312, 314, where the end cap 208 couples to interface electronics 310, 312, 314, contained within a metal tube 316. This embodiment keeps the footprint of the sensor small without sacrificing signal integrity. This PCB-based approach may be implemented in order to realize a robust package capable of accurate measurement of shear stress with minimal materials and engineering costs. In one approach, the sensor packaging may be implemented using sensors fabricated by Sells using a silicon-on-Pyrex fabrication and front-side wire-bond connections. Hydraulic smoothness may be achieved by milling a recess to the dimensions of the sensor die 202 in order to flush mount it into a PCB 208, where the sensor is wire bonded 204 to features on the top of the circuit board. This end cap 208 may be placed on an aluminum tube 316 containing the immediate interface circuitry, including a buffer amplifier 310, passives 312, and cabling 314, where the buffer amplifier 310 and passive components 312 to correctly bias the sensor 200. In an exemplary implementation, the aluminum tube of 0.5 inches in outer diameter and inner diameter of 0.25 inches may be included. This inner diameter is large enough for a single FR4 circuit board populated with the interface buffer and supporting passive to be placed in close proximity to the sensor die 202.

In order to minimize any induced stress from being transferred from the package to the sensor, both the cavity, the epoxy used to hold the sensor die in to the cavity, and the method used to fix the end cap to the rest of the package should be carefully selected. The sensor implementation may be affixed to the PCB board using Dualbond 707 epoxy that requires thermal cycling to cure. The mismatch of the coefficient of thermal expansion of the sensor die 202 and PCB 208, however, may cause additional stresses on the sensor die 202. The current package sought to avoid this mismatch issue may be addressed by epoxying the sensor die 202 using a room temperature curing epoxy and by minimizing the areas where the sensor die 202 is connected to the PCB 208 while still maintaining a secure fixture. This will allow the sensor die 202 and PCB 208 to expand and contract with temperature, while minimizing the stress at the epoxy contact points. Additionally, instead of a press fit to the supporting structure, the sensor plug may be fit into the end cap by matching the outer diameters and applying epoxy.

The sensor density and proximity to electronics trade off with one another within the package design. In order to minimize overall sensor footprint while still maintaining close proximity to the buffer electronics, the interface board may be placed such that it is perpendicular to the end cap. This increases the depth of the package but decreases the overall outer dimensions dramatically. As an added benefit, when the interface circuitry board is placed into a grounded aluminum tube, it shields the interface circuitry electronics (310, 312, 314) from EMI.

Figure 11:
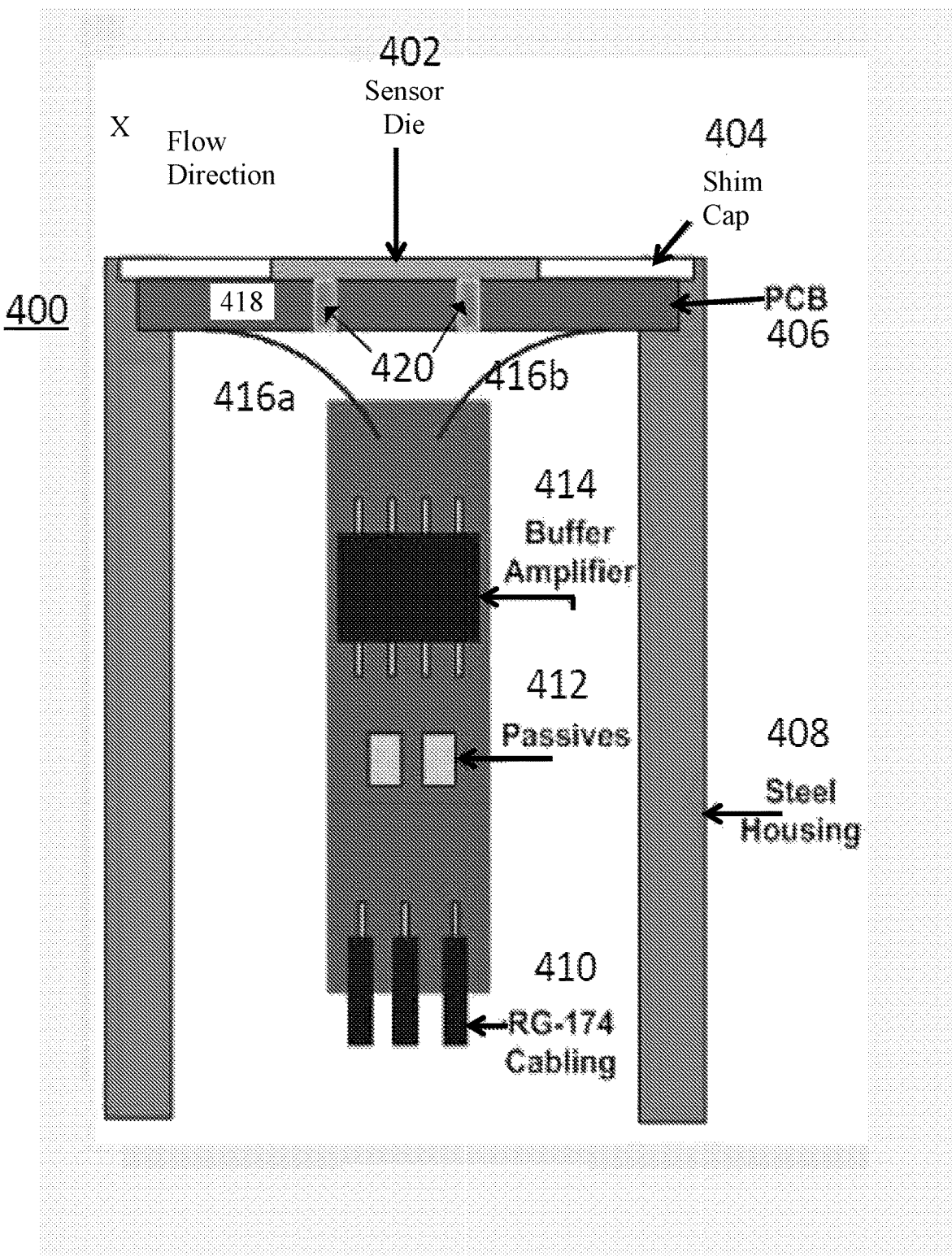
FIG. 11 illustrates a second exemplary sensor system tube packaging design of the Synch MOD/DEMOD system disclosed herein.

FIG. 11 illustrates a second exemplary sensor system tube packaging design of the Synch MOD/DEMOD system disclosed herein. By implementing through-wafer-interconnect technology, front-side wire-bonds as shown in the embodiment of FIG. 10 can be eliminated from the sensor structure, making it more hydraulically smooth. In particular, FIG. 11 illustrates a sensor system tube packaging design that accommodates TSV devices. Instead of a recess being milled into an end cap, the sensor die 402 is flip chip bonded onto a PCB 406. A precision laser machined plastic shim cap may be used to make the surface of the sensor package flush. The PCB end cap may include several small gold pads that fan out to vias 420, allowing for connection to the circuitry inside of the tube.

Figure 13:
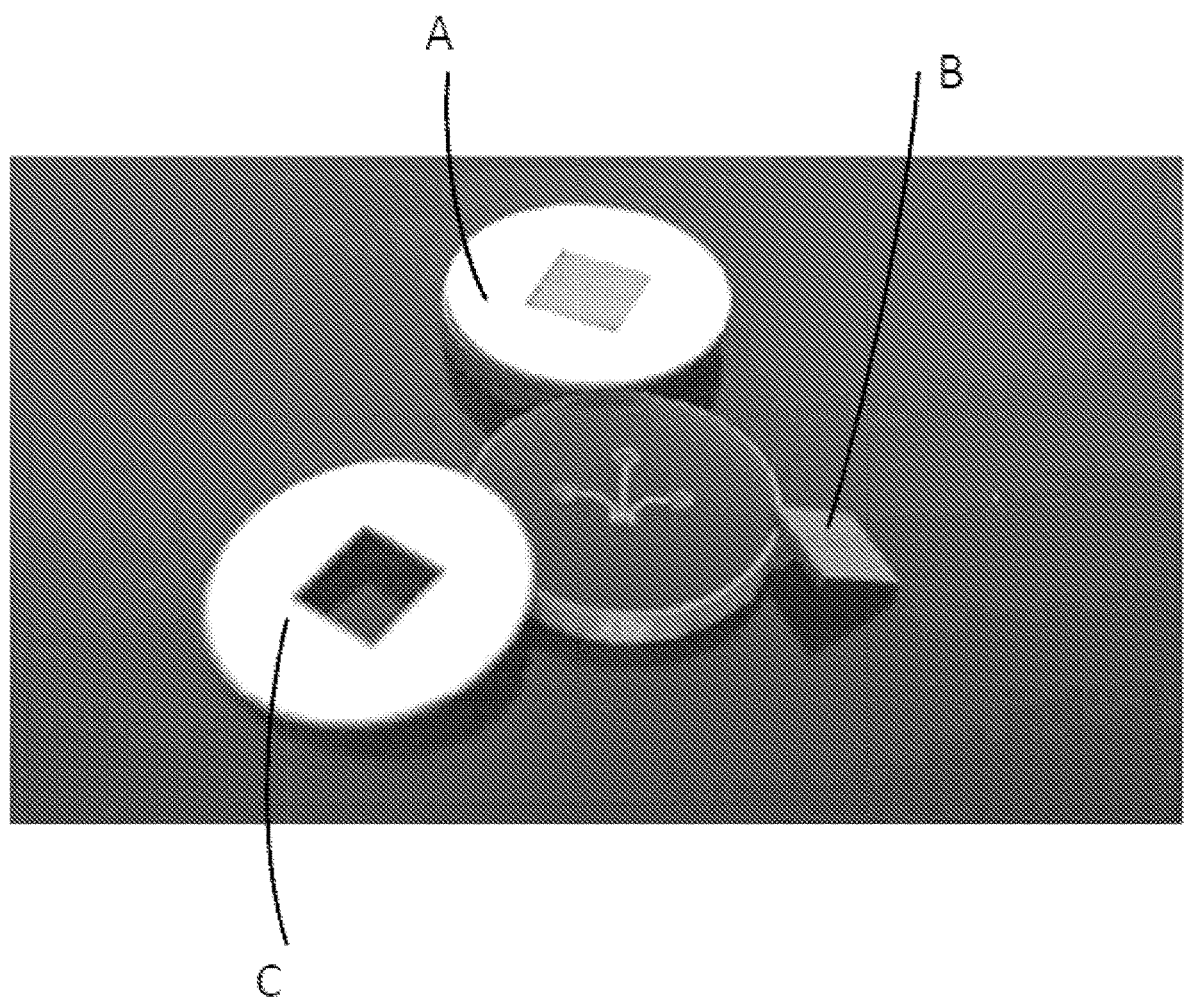
FIG. 13 a Second Generation package of the Synch MOD/DMOD described herein as compared to the Chandrasekharan sensor system package.

The shim cap 404 may be manufactured using an Oxford J-355-PS Laser Micromachining system. Although the shim cap 404 may be made of various materials (including but not limited to plastic), plastic may be a preferable material as opposed to metal due to the exposed sensor electrodes. While ideally there is no physical contact between the shim cap 404 and the side of the die 402, manufacturing the shim cap 404 out of a non-conductive material allows for some flexibility in the tolerance of the cap dimensions and placement. A representative shim cap, circuit board, and a 4 mm die are shown assembled (A) and in an exploded view (B, C) in FIG. 13.

Figure 12:
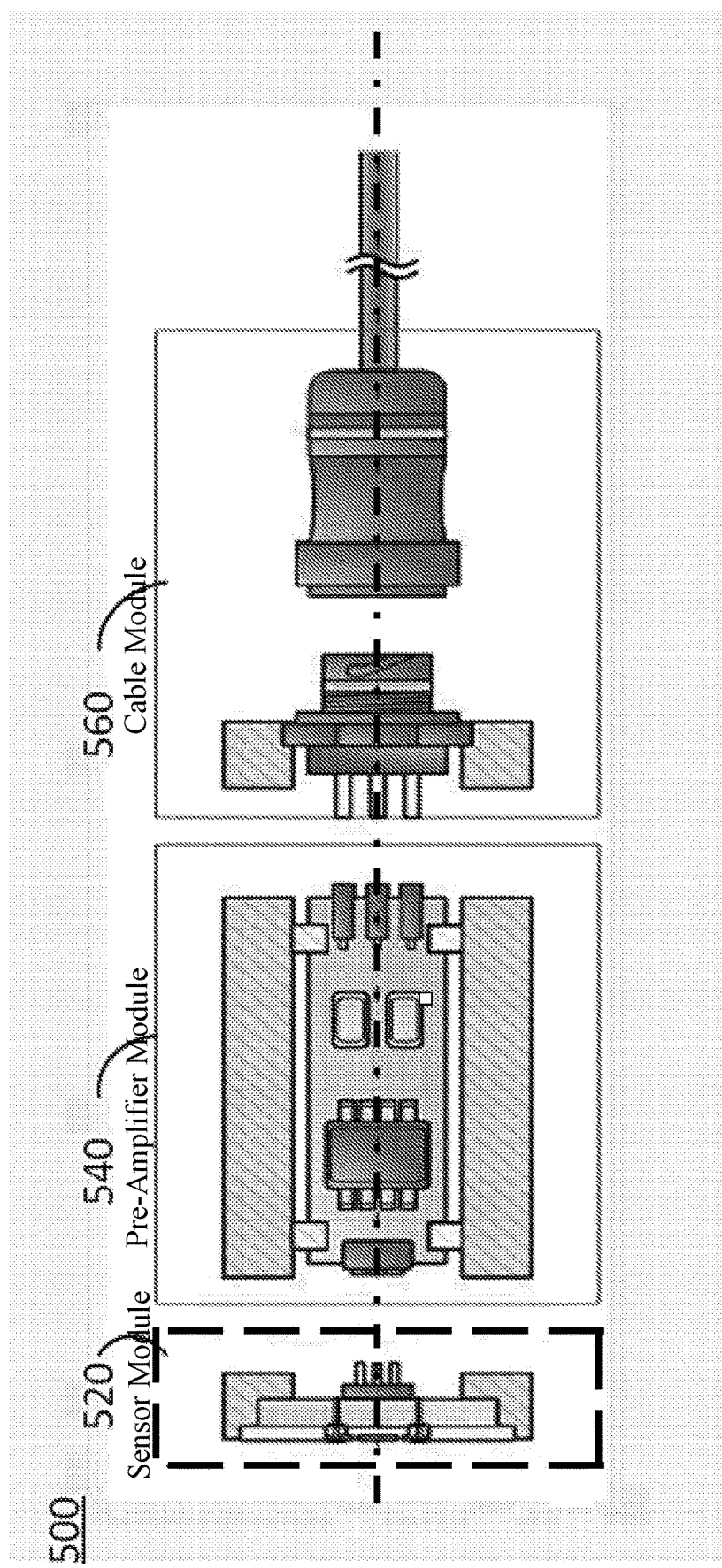
FIG. 12 illustrates a third exemplary sensor system tube packaging design of the Synch MOD/DEMOD system disclosed herein.

FIG. 12 illustrates a third exemplary sensor system tube packaging design of the Synch MOD/DEMOD system disclosed herein. The packaging may include a fully detachable three-part packaging scheme, where the sensor would reside in one block 520, buffer amplifier/interface electronics in a second block 540, and cabling/connectors as a third block 560. As shown, the sensor module 520 may comprise a sensor and may be a flush mounted CSSS with TSVs, where the electrical contacts on the backside provide voltage bias, grounding, and an output signal. The second component, a pre-amplifier module 540, may comprise a buffer amplifier that provides no gain, set a DC bias point, reduces output impedances to mitigate attenuation, and reduces passive elements to filter power line noise. It may comprise four connection points on one end of the sensor and five connection points on the other end for the cabling. The final component, cable module 560, may comprise the cabling connector with five pins that connect to a signal multi-conductor cable. This cabling connector may extend back to synch MOD/DMOD board carrying biases and power lines in, while carrying signal content out. Ideally all three components can be press fit together to provide electrical contact and detached for storage, transport, and replacement.

Figure 14:
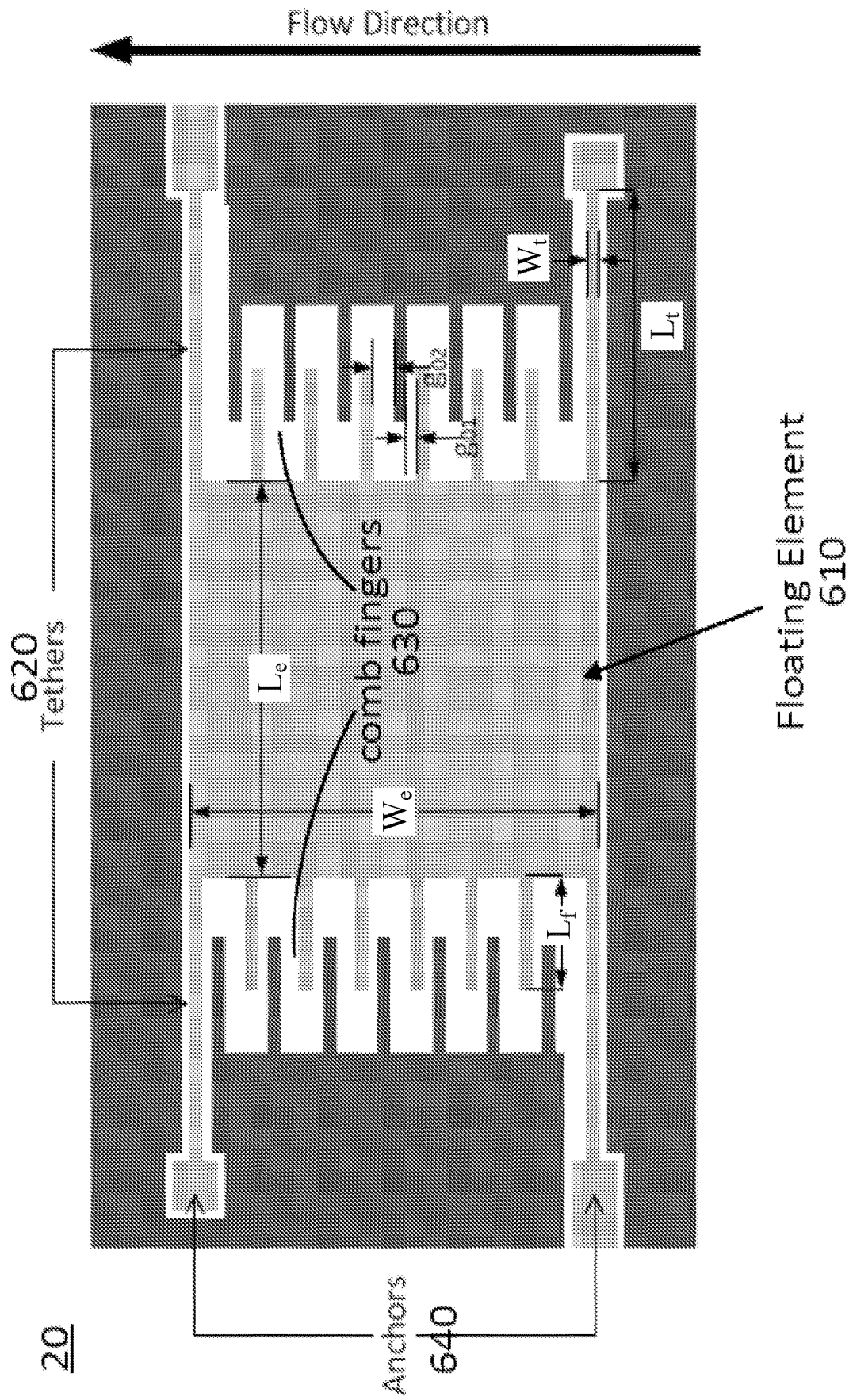
FIG. 14 illustrates the top-view of an exemplary sensor 20 having a floating element structure.
Figure 15:
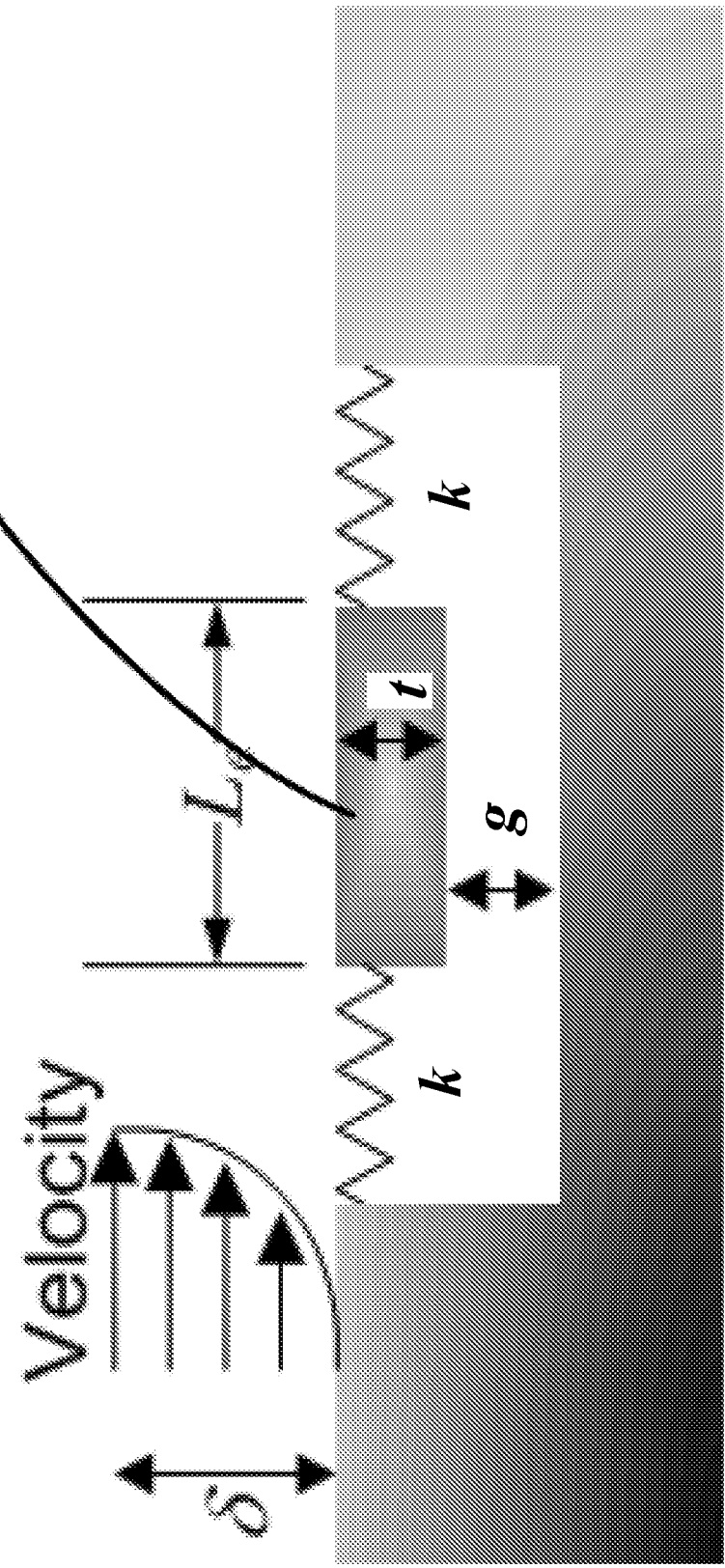
FIG. 15 illustrates the cross-sectional view of an exemplary sensor 20 having a floating element structure.

FIG. 14 illustrates the top-view of an exemplary sensor 20 having a floating element structure; while FIG. 15 illustrates the cross-sectional view of this exemplary sensor 20 having a floating element structure. An overview of the shear stress sensor structure and electromechanical transduction mechanism that may be implemented in the sensor system described above is disclosed in the following sections. As shown in FIG. 14, a floating element sensor 20 may comprise a moving flush mounted element 610 over which shear stress is integrated. The floating element 610 may be connected to tethers 620 which serve as restorative spring forces. The transducer possesses either a displacement sensor or a force-feedback system to directly relate the floating element displacement to the integrated shear force. The sensor system described herein may include the differential, floating element, capacitive transducer as shown. The design for the sensor system 100, however, is not limited to the design of this sensor and may include various other sensor designs.

The structure of the sensor consists of four tethers 620 supporting a floating element 610 which displaces under an input shear force. The sensor 20 may be modeled as a pair of clamped beams with the floating element 610 as a point load. Euler-Bernoulli beam theory may be used to translate an input shear force to a displacement, assuming small deflections. The displacement due to an input shear force can be expressed as:

$$\Delta = \frac{\tau_w W_e L_e}{4ET_t}\left(1 + \frac{NW_f L_f}{W_e L_e} + 2\frac{W_t L_t}{W_e L_e}\right)\left(\frac{L_t}{W_t}\right)^3$$

where $W_e$ and $L_e$ are the width and length of the floating element, $W_t$ and $L_t$ are the tether dimensions, $W_f$ and $L_f$ are the finger dimensions, N is the number of fingers, and $T_t$ is the thickness of the device, as shown in FIG. 14.

In operation, the interdigitated comb fingers 630 on either side of the floating element 610 make up a differential capacitive bridge, which when a voltage bias is applied results in a voltage output at the shared node of the bridge. Deflection of the floating element 610 due to an input shear force changes the distance between the comb fingers 630, and thereby, ultimately changing the capacitance of the bridge. As the sensor 20 moves, the capacitances across the comb fingers 630 change, while the charge on them remains constant. By definition, the charge on a capacitor is equal to the product of the capacitance and the voltage across it:

$$Q=CV.$$

Accordingly, a change in capacitance produces a change in voltage. This change in voltage may be measured and related back to displacement. Thereby, affecting the shear stress. Capacitance as a fundamental circuit element may be defined in terms of a differential. That is, capacitance is not defined for mean displacement and an applied Direct Current (DC) bias voltage. The impedance of a capacitor is equal to:

$$Z_{capacitor} = \frac{1}{j\omega C}.$$

Hence, the sensor is a differential pair of capacitors, as the equivalent circuit of the sensor illustrates in FIG. 4. In operation, at zero frequency, the impedance is infinite and, thus, any changes in capacitance are undetectable. This is clear by examining the output voltage $V_{out}$, which is undefined at $\omega=0$.

In order to detect dynamic changes in the floating element position, no additional considerations beyond impedance buffering must be made in the interface circuitry.

By means of a novel packaging design and newly implemented circuitry, a MEMS-based capacitive shear stress sensor may be implemented into the surface of a flat plate model within a standard open-loop low-speed wind tunnel. The shear stress may be obtained from a suitable fit of the boundary layer to a known profile shape—either laminar or turbulent—for uniform flow over a smooth flat plate. The shear stress sensor's mean results compare favorably to the mean shear stress extrapolations based on the PIV boundary layer profiles. Further, experimentation shows favorable data as to the exemplary sensor system's ability to track the mean wall shear stress differences between laminar and turbulent flows from a simple Stokes' layer calibration. Additionally, the sensor output range appears suitable for detection of boundary layer separation. Ultimately, this device proves to be a preferred implementation of a feedback sensor for flow control applications and a practical means of measuring wall shear stress on an aerodynamic surface.

As the sensor's capability for directly measuring DC wall shear stress in both laminar and turbulent flows has been verified against a PIV measurement, the sensor may also be implemented as a device by which separation is detected. Further, this sensor possesses the capability for measuring the AC component, where the assessment of frequency content from the AC signal of the shear stress sensor by comparisons to an unsteady pressure transducer and hot-wire anemometry are made.

It should be understood that the examples and embodiments described herein are for illustrative purposes only and that various modifications or changes in light thereof will be suggested to persons skilled in the art and are to be included within the spirit and purview of this application.

What is claimed is:

1. A shear-stress sensor system comprising:
 a sensor, wherein the sensor senses a wall shear stress at a surface of an object in a fluid and generates a sensor output signal; and
 an interface circuit comprising:
  a modulation section for biasing the sensor, wherein the modulation section generates at least one bias signal applied to the sensor, and wherein the modulation section comprises:
   an oscillator unit, wherein the oscillator unit outputs an input signal;
   a buffer circuit, wherein the buffer circuit receives the input signal and outputs a buffered signal;

a first phase adjust unit, wherein the first phase adjust unit receives the buffered signal and outputs a first bias signal of the at least one bias signal;

a second phase adjust unit, wherein the second phase adjust unit receives the input signal and outputs a phase adjusted input signal; and an inverter, wherein the inverter inverts the phase adjusted input signal and outputs a second bias signal of the at least one bias signal, wherein the second bias signal is approximately 180° degrees out of phase with the first bias signal;

a demodulation section for demodulating the sensor output signal, wherein the demodulation section comprises a rectification unit, and wherein the rectification unit rectifies the sensor output signal; and a demodulation control section, wherein the demodulation control section outputs a demodulation control signal;

wherein the demodulation control section comprises a phase adjustment unit, wherein the phase adjustment unit generates a phase adjusted signal in response to the at least one bias signal;

wherein the phase adjusted signal is processed to produce the demodulation control signal;

wherein the demodulation control signal comprises a square wave signal; and wherein the rectification unit receives the demodulation control signal and synchronizes the rectification of the sensor output signal.

2. The system of claim 1, wherein the sensor comprises a differential capacitor having a first end node and a second end node; and
wherein the first bias signal is applied to the first end node and the second bias signal is applied to the second end node.

3. The system of claim 1, wherein the demodulation control section further comprises:
a unity gain buffer circuit, wherein the unity gain buffer circuit receives one bias signal of the at least one bias signal and outputs a control signal, wherein the phase adjustment unit receives the control signal and outputs the phase adjusted signal;
a comparator, wherein the comparator receives the phase adjusted signal and outputs a first square wave signal;
a Zener regulator, wherein the Zener regulator receives the first square wave signal and outputs a regulated square wave signal; and
an inverter, wherein the inverter receives the regulated square wave signal and outputs the demodulation control signal.

4. The system of claim 1, wherein the sensor comprises:
a floating element, wherein the floating element comprises at least one set of capacitive comb fingers extending from a first side of the floating element;
at least one tether extending from the floating element for anchoring the floating element to a stationary surface; and
at least one set of stationary capacitive comb fingers interdigitated with the first set of capacitive comb fingers of the floating element such that initial gaps between fingers of the interdigitated first set of stationary capacitive comb fingers and first set of capacitive cob fingers are non-uniform; wherein the motion of the floating element in the fluid generates a change of capacitance used for generating the sensor output signal.

5. The system of claim 1, wherein the demodulation section further comprises:
a first signal conditioning circuit, wherein the first signal conditioning circuit receives the sensor output signal and outputs a first conditioned sensor output signal;
wherein the rectification unit has a first input, a control input, and an output, the first input coupled to receive the first conditioned sensor output signal from the first signal conditioning circuit, the control input coupled to receive the demodulation control signal, and in response to the demodulation control signal, a rectified signal is provided at the output; and
a second signal conditioning circuit, wherein the second signal conditioning circuit receives the rectified signal.

6. The system of claim 5, wherein the first signal conditioning circuit comprises:
a unity gain amplifier circuit, wherein the unity gain amplifier circuit receives the sensor output signal to generate an amplified signal;
a high impedance sensor, wherein the high impedance sensor stores the charge from the amplified signal; and
a band pass filter, wherein the band pass filter generates the first conditioned sensor output signal by filtering a portion of the stored charge of the amplified signal in accordance with a predetermined frequency range.

7. The system of claim 5, wherein the second signal conditioning circuit comprises a low pass filter.

8. The system of claim 5, wherein the rectification unit comprises:
a buffer, wherein the buffer generates a buffered signal in response to the first conditioned sensor output signal;
an inverter, wherein the inverter inverts the first conditioned sensor output signal and generates an inverted signal; and
a switch, wherein the switch selects between the buffered signal and the inverted signal to produce the rectified signal, wherein the switch receives the demodulation control signal such that the demodulation control signal controls the selection of the buffered signal or the inverted signal as the rectified signal.

9. The system of claim 1, wherein the sensor is a MEMS sensor, the MEMS sensor comprises a package, and the package comprises:
a Printed Circuit Board (PCB) comprising at least one via, a recess, a front surface, and a back surface, wherein:
the at least one via extends from the front surface to the back surface,
a sensor die is seated in the recess of the PCB, wherein the sensor die supports the MEMS sensor,
at least one wire-bond is coupled to the sensor die, and
at least one conductive layer is within the at least one via extending from the front surface of the PCB to the back surface of the PCB, wherein the wire-bond couples the sensor die to the conductive layer;
a tube structure comprising a first end and a second end, wherein the back surface of the PCB couples to the first end of the tube structure; and
an interface circuit seated in the tube structure through the second end and coupled to at least one conductive layer at the back surface of the PCB.

10. The system of claim 9, wherein the tube structure comprises a metal.

11. The system of claim 1, wherein the sensor is a MEMS sensor, the MEMS sensor comprises a package, and the package comprises:

a Printed Circuit Board (PCB) comprising a front surface, a back surface, and at least one via extending from the front surface through to the back surface;

at least one conductive layer within the at least one via extending from the front surface through to the back surface of the PCB;

a Through Silicon Via (TSV) sensor die having dimensions of length, width, and depth, wherein the TSV sensor die is in an overlying position to the front surface of the PCB;

a shim cap on the PCB top surface comprising a recess having the dimensions of the TSV sensor die, wherein the TSV sensor die is seated in the shim cap, the at least one conductive layer is operatively connected to the back surface of the TSV sensor die, each conductive layer lies within the length, and width of the TSV sensor die in an underlying relationship to the TSV sensor die;

a tube structure comprising a first end and a second end, wherein the PCB and the shim cap are seated flush within the walls of the first end;

at least one wire-bond coupled to the back surface of the PCB; and an interface circuit seated in the tube structure and coupled to the at least one wire-bond.

12. The system of claim 11, wherein the tube structure comprises a metal.

\* \* \* \* \*